United States Patent [19]

Shaw et al.

[11] Patent Number: 5,166,901
[45] Date of Patent: Nov. 24, 1992

[54] PROGRAMMABLE MEMORY CELL STRUCTURE INCLUDING A REFRACTORY METAL BARRIER LAYER

[75] Inventors: Gerard J. Shaw, San Jose; Jok Y. Go, Santa Clara; Jay H. Chun, Fremont; Bruce G. Armstrong, Belmont; Jerry W. Drake, Los Gatos, all of Calif.

[73] Assignee: Raytheon Company, Lexington, Mass.

[21] Appl. No.: 662,381

[22] Filed: Feb. 26, 1991

Related U.S. Application Data

[63] Continuation of Ser. No. 173,005, Mar. 28, 1988, abandoned, which is a continuation of Ser. No. 862,943, May 14, 1986, abandoned.

[51] Int. Cl.$^5$ .................. G11C 17/14; H01L 29/44; H01L 29/52
[52] U.S. Cl. ...................... 365/105; 365/96; 365/163; 257/476; 257/530
[58] Field of Search .................. 365/113, 163, 96, 103, 365/104, 105, 175; 357/2, 12, 37, 67, 71, 65

[56] References Cited

U.S. PATENT DOCUMENTS

| | | | |
|---|---|---|---|
| 4,177,475 | 12/1979 | Holmberg | 357/2 |
| 4,203,123 | 5/1980 | Shanks | 365/163 |
| 4,499,557 | 2/1985 | Holmberg et al. | 365/163 |
| 4,531,144 | 7/1985 | Holmberg | 357/67 |

OTHER PUBLICATIONS

Malhotra et al., *Fundamentals of Memory Switching in Vertical Polycrystalline Silicon Structures*, IEEE Transactions on Electron Devices, vol. ED32, No. 11, Nov. 1985, pp. 2441-2449.

Primary Examiner—Glenn Gossage
Attorney, Agent, or Firm—Judith A. Caplan; Richard M. Sharkansky

[57] ABSTRACT

A memory cell comprising a memory region of amorphous silicon, such memory region having a first state of substantial electrical nonconductivity programmable to a second state of substantial electrical conductivity in response to an electrical programming signal applied thereto. The memory region is disposed over a metal Schottky contact, such as platinum-silicide (PtSi), formed in a support body. A first barrier layer comprising a refractory metal such as titanium-tungsten (TiW) is disposed between the memory region and Schottky contact. A first input terminal comprising a metal strip conductor, such as aluminum, is disposed over the memory region, with a second refractory metal barrier layer being disposed between the memory region and metal strip conductor. A second input terminal is disposed within the support body. With such arrangement, the material of the Schottky contact (PtSi) is substantially prevented from migrating or diffusing into the silicon memory region upon application of the electrical programming signal between the first and second input terminals, thereby preserving the structure of the metal contact and maintaining a low reverse bias leakage current for a Schottky diode comprising such metal contact. Also, the level of the programming signal may be increased, providing more complete programming of the memory region to the second, electrically conductive state.

15 Claims, 3 Drawing Sheets

PROGRAMMABLE MEMORY CELL STRUCTURE INCLUDING A REFRACTORY METAL BARRIER LAYER

This application is a continuation of application Ser. No. 173,005 filed Mar. 28, 1988, now abandoned, which is a continuation of Ser. No. 862,943 filed May 14, 1986 (now abandoned).

BACKGROUND OF THE INVENTION

This invention relates generally to memory cells and more particularly to memory cells having a memory region comprising material having a first state of substantial electrical nonconductivity programmable to a second state of substantial electrical conductivity in response to an electrical signal applied thereto.

As is known in the art, memory cells have a wide range of applications, for example use in programmable memory arrays such as PROMs and logic and gate arrays. One type of memory cell, known as a "vertical fuse" memory cell, is discussed in U.S. Pat. No. 4,499,557, issued on Feb. 12, 1985 to Scott Holmberg et al and assigned to Energy Conversion Devices, Inc., of Troy, Mich. Such vertical fuse memory cell comprises a memory region comprising amorphous silicon being nominally in a first, substantially electrically nonconducting state. The memory region is supported by a doped (typically with n-type dopant) epitaxial layer of a semiconductor body. The memory region is disposed on a metal contact set in the doped epitaxial layer. The metal contact typically comprises platinum and forms a Schottky junction with the doped epitaxial layer. A first input terminal of the memory cell, typically comprising a strip of a highly electrically conductive metal, such as aluminum, is disposed above the memory region in electrical communication therewith. A barrier layer, comprising a refractory metal such as titanium-tungsten (TiW), is disposed between the memory region and the aluminum strip, such barrier layer preventing aluminum atoms from diffusing into and damaging the silicon memory region. A second input terminal of the memory cell is formed in the doped epitaxial layer, and typically comprises a buried subcollector region of heavily doped (such as with n+-type conductivity dopant) silicon.

Nominally, the first and second input terminals of the memory cell are electrically isolated from each other by the nominally electrically nonconductive memory region. Such nonconducting condition represents a first logic state of the memory cell. However, upon application of a suitable electrical programming signal between the first and second input terminals, the substantially electrically nonconducting state of the amorphous silicon of the memory region is nonresettably converted to a substantially electrically conducting state, thereby electrically coupling the first and second input terminals together through a low resistance, typically 100 ohms, and setting the memory cell to a second logic state.

While such a memory cell functions satisfactorily in some applications, the electrical programming signal, typically a current pulse, generates heat in the memory region and the Schottky metal contact. If the current pulse level is too high, sufficient heat will be generated to cause the metal of the Schottky contact to diffuse or migrate into the converted, electrically conducting silicon of the memory region. This increases the reverse leakage current of the Schottky diode comprising the metal contact. The total reverse leakage current for the array increases as additional individual memory cells are subsequently programmed. Since there are commonly many such memory cells (and hence Schottky diodes) in a typical memory array, such increased reverse leakage current results in a large leakage current drain from the memory array power supply, thereby reducing the current pulse amplitude which such power supply is able to provide for subsequently-programmed memory cells in the array. The programming current pulse level for the initially-programmed memory cells may be decreased to avoid this problem, but if such level is made too low, the substantially electrically nonconducting state of the memory region may not change to the substantially electrically conducting state; that is, the memory cell may not be properly programmed from the first logic state to the second logic state.

SUMMARY OF THE INVENTION

In accordance with the present invention, a memory cell is provided comprising: a memory region having a first state of substantial electrical nonconductivity and being programmable to a second state of substantial electrical conductivity in response to an electrical signal applied thereto, the memory region being disposed over a support body; and, means, disposed between the memory region and the support body, for inhibiting material of said memory region from combining with material of the support body. With such arrangement, material of the support body, which may comprise Schottky contact metal such as platinum silicide (PtSi), is substantially prevented from migrating or diffusing into the memory region, thereby maintaining a low reverse bias leakage current for a Schottky diode comprising such metal contact. Also, the level of the electrical programming signal may be increased, providing more complete programming of the memory region to the second, electrically conductive state.

In a preferred embodiment of the present invention, a programmable memory array is provided comprising a plurality of memory cells. Each memory cell comprises a memory region having a substantially electrically nonconductive state settable and nonresettable to a substantially electrically conductive state. An input terminal is electrically coupled to the memory region. A first barrier layer, comprising a refractory metal, is disposed between the memory region and the input terminal. The memory region is supported on a body, the body including a metal Schottky contact electrically coupled to the memory region. A second barrier layer comprising a refractory metal is disposed between the memory region and the metal Schottky contact.

The present invention also provides a process for fabricating a memory cell comprising the steps of: providing a support body comprising a semiconductor material; depositing a first layer of refractory metal over a region of the support body; and, forming a memory region comprising amorphous silicon over the first layer of refractory metal.

BRIEF DESCRIPTION OF THE DRAWINGS

The foregoing features of the present invention and the advantages thereof may be fully understood from the following detailed description read in conjunction with the accompanying drawings wherein.

DESCRIPTION OF THE PREFERRED EMBODIMENTS

Figure 1:
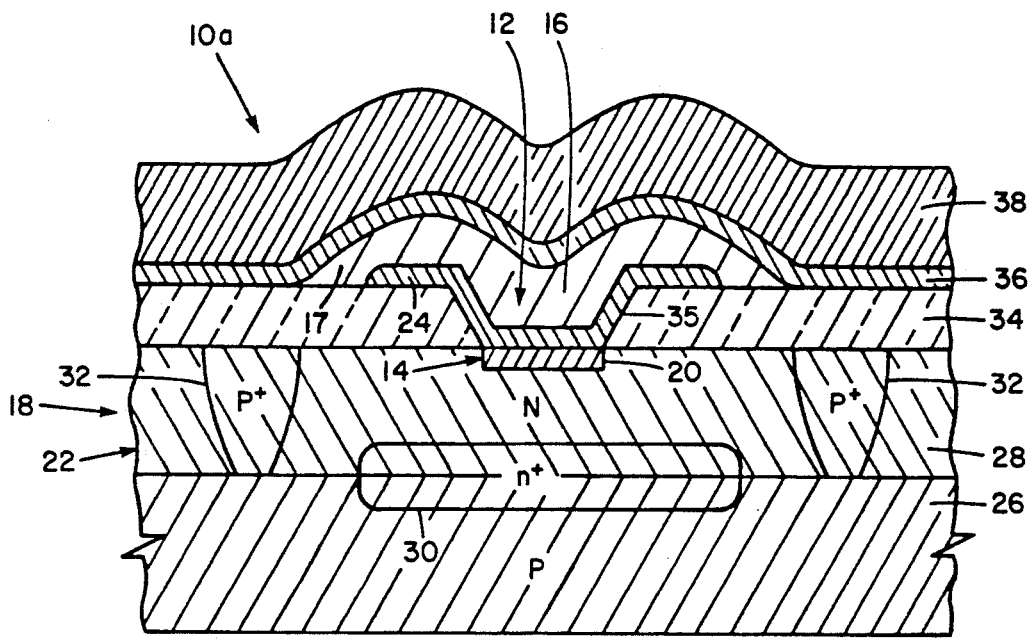
FIG. 1 is a cross-sectional view of the vertical fuse memory cell of the present invention.
Figure 2:
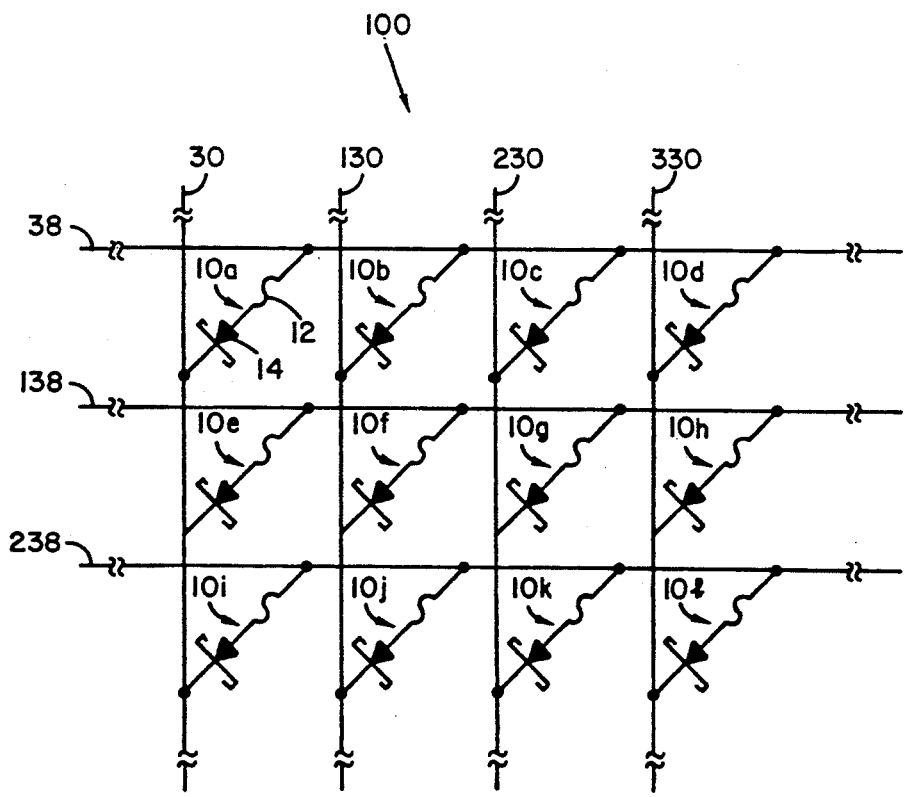
FIG. 2 is a partial schematic diagram of an array of memory cells of FIG. 1.

Referring now to FIG. 1, shown is a cross-sectional view of the memory cell 10a of the present invention, an array 100 of such memory cells 10a-10l being shown schematically in FIG. 2. Each memory cell 10a-10l is of identical construction and comprises vertical fuse 12 electrically coupled to Schottky diode 14, as shown schematically in FIG. 2. The details of construction of memory cells 10a-10l are discussed hereinafter. Suffice here to say that vertical fuse 12 comprises memory region 16 having a first state of substantial electrical nonconductivity programmable to a second state of substantial electrical conductivity in response to an electrical signal applied to memory region 16 in a manner to be described. Memory region 16 is disposed over support body 18. Here, support body 18 comprises metal Schottky contact 20 disposed in semiconductor member 22. A lower barrier layer 24, here comprising a refractory metal, such as titanium-tungsten (TiW), is disposed between memory region 16 and support body 18, specifically between memory region 16 and metal Schottky contact 20. With such arrangement, the metal comprising Schottky contact 20 is substantially prevented from migrating or diffusing into memory region 16, thereby maintaining a low reverse bias leakage current for Schottky diode 14. Also, since an electrically conductive thermal mass barrier is provided between metal contact 20 and memory region 16 by lower barrier layer 24, the level of the electrical programming signal applied to memory cell 10a may be increased without diffusing the metal of Schottky contact 20 into memory region 16, thereby allowing more complete programming of memory region 16, as will be described.

More specifically, the support body 18 for memory region 16 comprises semiconductor member 22, here made of silicon. Semiconductor member 22 comprises bulk substrate region 26 of any conventional thickness, here greater than 500 microns. Substrate 26 is doped with a suitable concentration of a selected conductivity dopant, here, p-type dopant, and has a surface in the <100> crystallographic plane. Subcollector region 30, comprising n+-type doped silicon, is formed in an upper region of bulk substrate 26. Subsequently, epitaxial layer 28 having a suitable concentration of n-type conductivity dopant is grown over the upper surface of substrate 26 in a conventional manner, it being noted that a portion of subcollector region 30 diffuses into a lower region of epitaxial layer 28 in a well-known manner, as shown in FIG. 1. Here, the thickness of epitaxial layer 28 is between 1.5 and 3.5 microns. Also formed in epitaxial layer 28 in a conventional manner are p+-type isolation regions 32. Here, such isolation regions 32 are formed on each side of subcollector region 30 by diffusing p+-type conductivity dopant into epitaxial layer 28. An insulating layer 34, here comprising silicon dioxide (SiO$_2$), is then deposited or grown on the upper surface of epitaxial layer 28 to a conventional thickness of approximately 5000 angstroms, as shown. Opening 35 is conventionally etched in SiO$_2$ layer 34 and metal Schottky contact 20, here comprising platinum silicide (PtSi) although other metals may be substituted for platinum as is well-known, is conventially formed in an upper region of epitaxial layer 28. Schottky contact 20 and n-type epitaxial layer 28 form a Schottky junction, that is, Schottky diode 14.

As discussed, vertical fuse 12 of memory cell 10a comprises memory region 16 having a first, substantially electrically nonconductive state programmable to a second, substantially electrically conductive state by application of a suitable electrical signal to memory region 16. Here, memory region 16 comprises an area of an amorphous silicon layer 17 having a thickness of between 250 and 3000 angstroms, such thickness being selected here to be approximately 1000 angstroms. As shown in FIG. 1, memory region 16 is disposed over support body 18 and specifically over metal Schottky contact 20 thereof. Disposed between memory region 16 and metal contact 20 is lower barrier layer 24. As shown in FIG. 1, lower barrier layer 24 is disposed on metal contact 20 and insulating layer 34, such lower barrier layer 24 terminating on insulating layer 34 a short distance beyond opening 35. Amorphous silicon layer 17 is disposed over lower barrier layer 24, with memory region 16 being separated from metal contact 20 by lower barrier layer 24. As shown, amorphous silicon layer 17 extends a short distance beyond the end of lower barrier layer 24 and terminates on insulating layer 34. Lower barrier layer 24 here comprises a refractory metal or metal alloy, such as titanium tungsten (TiW), and provides an electrically conductive thermal mass barrier between silicon memory region 16 and PtSi Schottky contact 20, as will be described in detail hereinafter. Lower barrier layer 24 is here formed by conventional sputtering techniques, although chemical vapor deposition may alternately be employed to form such barrier layer 24. The thickness of lower barrier layer 24 here ranges between 500 and 3000 angstroms, with approximately 1250 angstroms being selected here. It is noted that the required thickness of lower barrier layer 24 depends on such factors as the material used (here, TiW) and the process used to deposit the lower barrier layer material on metal contact 20 and insulating layer 34.

An upper barrier layer 36 is disposed over amorphous silicon layer 17, and hence above memory region 16, as shown, and also overlays insulating layer 34 beyond the termination of amorphous silicon layer 17. Upper barrier layer 36 here comprises a refractory metal or metal alloy, such as TiW deposited by sputtering or chemical vapor deposition, for example, to a thickness of between 500 and 3000 angstroms, with a thickness of approximately 1250 angstroms being selected here. Overlaying upper barrier layer 36 is a strip of metal, such as aluminum, which is highly electrically conductive and provides an electrical input terminal for memory cell 10a, as will be explained. Upper barrier layer 36, disposed between aluminum contact 38 and memory region 16, prevents aluminum atoms from migrating or diffusing into silicon memory region 16 and degrading the programmable characteristics of such memory region 16. That is, upper barrier layer 36 prevents the aluminum of metal strip 38 from diffusing into silicon memory region 16 as such aluminum metal heats up in a manner to be discussed when the electrical programming signal is applied to memory cell 10a.

Referring now to FIG. 2, memory cell 10a is shown as part of an array 100 of like memory cells 10a–10l. Here, twelve such memory cells are shown, but it is understood that an actual array will typically be much larger. Array 100 is an X-Y addressable array comprising X-address lines 38, 138, 238 and Y-address lines 30, 130, 230, 330. Each memory cell 10a–10l is singly addressed by activating a selected pair of such X-Y address lines. For example, memory cell 10a is addressed through X-address line 38 and Y-address line 30. Referring again to FIG. 1, it is seen that X-address line 38 corresponds to the aluminum strip layer 38 overlaying upper barrier layer 36 and memory region 16. Y-address line 30 is formed by n+-subcollector region 30 disposed below lower barrier layer 24 and memory region 16. Thus, it may be appreciated that aluminum strip layer 38 and subcollector 30 comprise first and second input terminals for memory cell 10a. A little thought further reveals that aluminum strip 38 and subcollector 30 are electrically coupled to memory region 16 through upper barrier layer 36 and lower barrier layer 24, respectively. It should be noted that insulating layer 34 must be sufficiently thick to have a sufficiently high dielectric breakdown strength to maintain electrical isolation between the X-address lines 38, 138, 238 and Y-address lines 30, 130, 230, 330 through such insulating layer 34.

In operation, each memory cell 10a–10l is programmable and non-reprogrammable to store either a logic "0" or a logic "1" in the memory region 16 thereof. Taking memory cell 10a as an example, before programming the amorphous silicon memory region 16 thereof is a dielectric material having a substantially electrically nonconductive state and hence a high resistance, here approximately 100,000 ohms. Such nonconductance corresponds to a first logic state, such as a logic "0", of memory cell 10a. Memory cell 10a is programmed to a logic "1" state by applying a suitable electrical signal, typically in the form of an electrical pulse having sufficient magnitude and duration, here, 20 microseconds (μsec), to memory region 16. Here, such programming pulse is applied across X-Y address lines 38, 30, and hence across aluminum strip 38 and subcollector 30 of memory cell 10a. This produces a current pulse, here having an amplitude of 20 milliamps (mA), through memory region 16 from strip 38 to subcollector 30, changing the substantially electrically nonconducting state of memory region 16 to a substantially electrically conducting state, and hence a state having low resistance, here approximately 100 ohms. Such substantially electrical conductivity state corresponds to a second logic state of memory cell 10a, for example a logic "1". Once the substantially electrically nonconducting state of memory region 16 is changed to the substantially electrically conducting state, the process may not be reversed. That is, memory region 16 is settable and nonresettable from a first, substantially electrically nonconductive state to a second, substantially electrically conducting state.

As discussed, the application of an electronic programming pulse across the input terminals of memory cell 10a (that is across aluminum strip 38 and silicon subcollector 30) produces a current pulse through upper barrier layer 36, memory region 16, lower barrier layer 24 and Schottky diode 14. It is this current flow through memory region 16 which changes the high-resistance (i.e., 100,000 ohms) state of memory region 16 to the low-resistance (i.e., 100 ohms) state. However, such current flow also generates heat in memory region 16. It has been found that in prior art devices, such as those described in the above-identified U.S. Pat. No. 4,499,557, which did not include lower barrier layer 24, the heat generated within the memory cell by said current pulse may damage the Schottky diode associated therewith. Specifically, it has been discovered that the heat generated by such current pulse may be greater than the eutectic temperatures of the silicon memory region 16 and the PtSi contact 20 of the Schottky diode 14. In such case, portions of the PtSi Schottky contact react with and migrate (i.e. diffuse) into the silicon of the memory region, degrading the structure of the PtSi contact and increasing the reverse-bias leakage current of the Schottky diode comprising such PtSi contact. The total reverse leakage current for the memory array increases as additional individual memory cells are subsequently programmed. In large memory arrays containing, for example, thousands of memory cells, a small increase in the reverse bias leakage current of the individual Schottky diodes of the programmed individual memory cells in the array results in a large leakage current drain from the memory array power supply, thereby reducing the current pulse amplitude which such power supply is able to provide for subsequently-programmed memory cells in the array. The amplitude and duration of the programming pulse applied to the initially-programmed individual memory cells may be reduced in an attempt to avoid this problem. However, a minimum amount of current is required to change the substantially electrically nonconducting state of a memory region to the substantially electrically conducting state, and hence to program the memory cell. Thus, in prior art memory cells, such as those of the above-identified U.S. Pat. No. 4,499,557, the electrical programming pulse must be tailored to produce a current pulse having a level within a narrow current window: too much current damages the Schottky diode as described above; and too little current will fail to change the memory region from an electrically nonconducting state to an electrically conducting state, and thus fail to program the memory cell.

The present invention solves these problems by providing lower barrier layer 24, here comprising a refractory metal such as titanium-tungsten (TiW), between memory region 16 and support body 18, specifically between such memory region and PtSi metal Schottky contact 20. The use of TiW for lower barrier layer 24 is illustrative; other metals such as refractory metals or alloys thereof may be used. For example, titanium or tungsten alone may be used as the material of lower barrier layer 24. Lower barrier layer 24 need only be electrically conductive and have a higher melting temperature and eutectic temperature than either the silicon of memory region 16 or the material of metal Schottky contact 20 (here PtSi). For example, TiW has a eutectic temperature of greater than 1200° C., while the lowest eutectic temperature of PtSi (containing 23% silicon) is about 800° C. The separation that lower barrier layer 24 provides between PtSi metal contact 20 and memory region 16 substantially prevents the PtSi from migrating or diffusing into the silicon of memory region 16 during programming, thereby preserving the structure of PtSi contact 20 and maintaining a relatively low reverse-bias leakage current for Schottky diode 14. Therefore, it may be appreciated that lower barrier layer 24 provides an electrically conductive thermal barrier between PtSi Schottky contact 20 and silicon memory region 16. Also, since the eutectic temperature of lower barrier layer 24 is so high, the level and duration of the programming signal (and hence of the current pulse) applied to memory cell 10a may be substantially increased without generating enough heat to diffuse the refractory metal (e.g. TiW) of lower barrier layer 24 into memory region 16. Such increased programming signal level and duration provides more complete conversion of the silicon of memory region 16 to the substantially electrically conducting state, thereby further decreasing the low resistance of the converted silicon and hence improving the programming of memory cell 10a, without causing diffusion of the material of lower barrier layer 24 into memory region 16.

Figure 3:
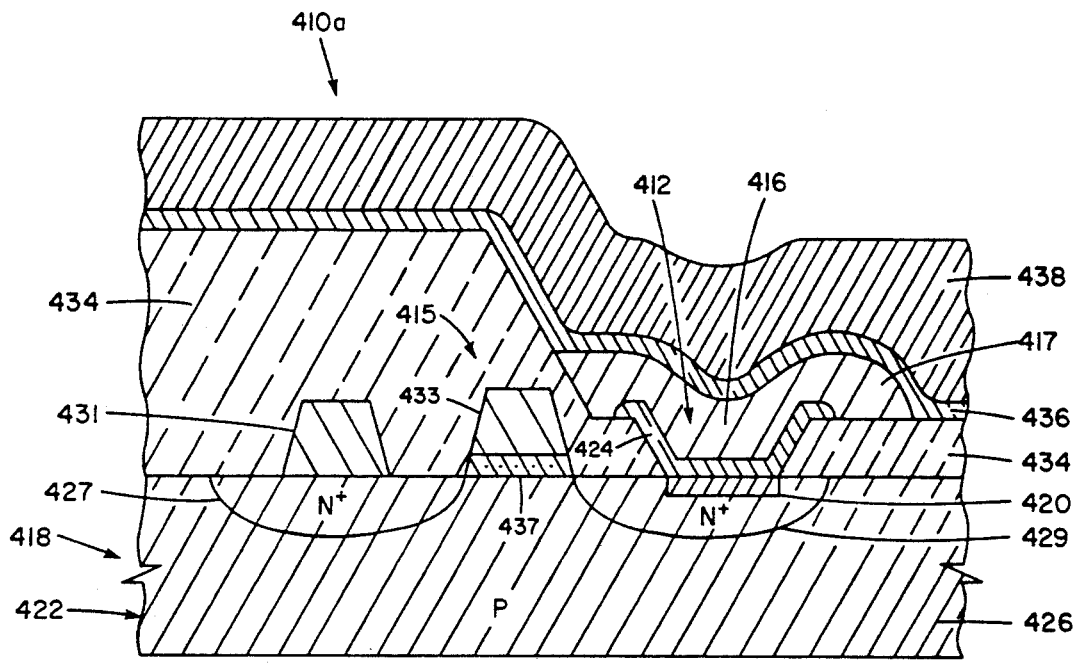
FIG. 3 is a cross-sectional view of a second embodiment of the memory cell of the present invention.
Figure 4:
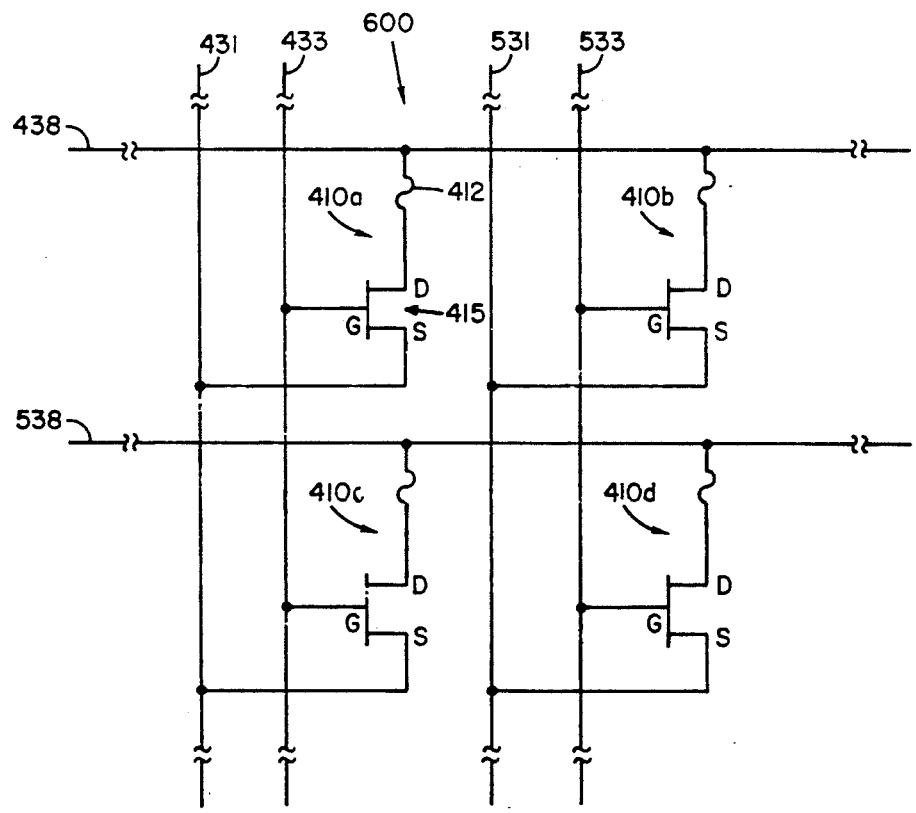
FIG. 4 is a partial schematic diagram of an array of memory cells comprising the memory cell of FIG. 3.

Referring now to FIG. 3, a vertical fuse memory cell 410a of a second embodiment of the present invention is shown. Memory cell 410a is shown schematically in FIG. 4 as part of an array 600 of identically-constructed memory cells 410a-410d. Each memory cell 410a-410d comprises vertical fuse 412 and field-effect-transistor (FET) 415. Vertical fuse 412 comprises memory region 416 disposed in a layer 417 of amorphous silicon overlaying lower barrier layer 424. Upper barrier layer 436 is disposed above amorphous silicon layer 417 and separates layer 417 and the memory region 416 thereof from metal strip 438, as shown. Metal strip 438 here comprises aluminum and serves as a first input terminal of memory cell 410a.

Vertical fuse 412 is disposed on an insulating layer 434, here comprising $SiO_2$, of support body 418, here comprising metal contact 420 disposed in silicon semiconductor member 422. Semiconductor member 422 comprises bulk substrate 426, here having a thickness of greater than 500 microns to provide structural support for memory cell 410a and being doped with a suitable concentration of p-type dopant. Source region 427 and drain region 429 are formed in bulk substrate 426 in a conventional manner, here by diffusing $n^+$-type conductivity dopant into such substrate 426. Thus, source and drain regions 427, 429 comprise $n^+$-type conductivity silicon. Contact is made to source region 427 by growing poly-silicon region 431 thereon, such connection being shown schematically in FIG. 4. The gate electrode of FET 415 is formed by growing a poly-silicon region 433 over a thin layer of insulating material 437 (here $SiO_2$) deposited on the surface of substrate 426 between source and drain regions 427, 429.

An ohmic contact is made to $n^+$-drain region 429 by forming a suitable metal contact 420, here PtSi, in the surface region of drain region 429 in a conventional manner. Metal contact 420 is disposed beneath amorphous silicon region 416 and separated therefrom by lower barrier layer 424. Alternately, metal contact 420 may be omitted and lower barrier layer may be disposed directly on $n^+$-drain region 429. Lower barrier layer 424 and upper barrier layer 436 comprise a refractory metal, such as TiW.

In operation, memory cell 410a has a first logic state, such as a logic "0", corresponding to the first, highly electrically nonconductive state of amorphous silicon memory region 416. Memory cell 410a may be programmed to a second logic state, such as a logic "1", by applying an electrical programming signal to memory region 416 to convert the amorphous silicon thereof to substantially electrically conducting silicon, as has been described above. Such programming is done by applying the programming signal, typically in the form of an electrical pulse, to the drain and gate electrodes of FET 415 while coupling the source electrode thereof to ground potential. Thus, from FIG. 4 it is seen that the programming pulse is applied to poly-silicon gate line 433 and aluminum strip 438, and poly-silicon strip 431 is coupled to ground. It is understood that memory cell 410a is typically part of a large array and is uniquely programmed by applying the electrical programming pulse across lines 433, 438 and 431, as discussed.

Referring again to FIG. 3, application of the programming pulse to FET 415 as described produces a current pulse through upper barrier layer 436, memory region 416, lower barrier layer 424, metal contact 420 and $n^+$-drain region 429. As discussed, such current changes the substantially nonconducting state of memory region 416 to a substantially conductive state, and hence programs memory cell 410a from a logic "0" state to a logic "1" state. As discussed, once such programming is done, memory region 416 may not be reset to a highly nonconductive state (i.e. the electrically conductive silicon in region 416 may not be reconverted to nonconducting amorphous silicon). Lower barrier layer 424, here made from refractory metal such as TiW, provides an electrically conducting, thermal mass region between memory region 416 and metal contact 420 in the same manner as described above with reference to FIG. 1. That is, such lower barrer layer 424 prevents atoms from the metal contact 420 from migrating into silicon memory region 416 in response to the heat generated in memory cell 410a by the programming current pulse, which may create temperatures higher than the eutectic temperature of the metal contact 420 (e.g., PtSi) but lower than the high eutectic temperature of the lower barrier layer 424. Further, due to the high eutectic temperatures of refractory metals such as TiW, the level of the current pulse applied to memory cell 410a, and hence the heat generated thereby, may be increased without migration or diffusion of the lower barrier layer 424 metal into memory region 416. Thus, more complete programming of the substantially electrically nonconductive amorphous silicon of memory region 416 to substantially electrically conductive silicon may be achieved, thereby further lowering the resistance of the programmed memory region 416.

Figure 5:
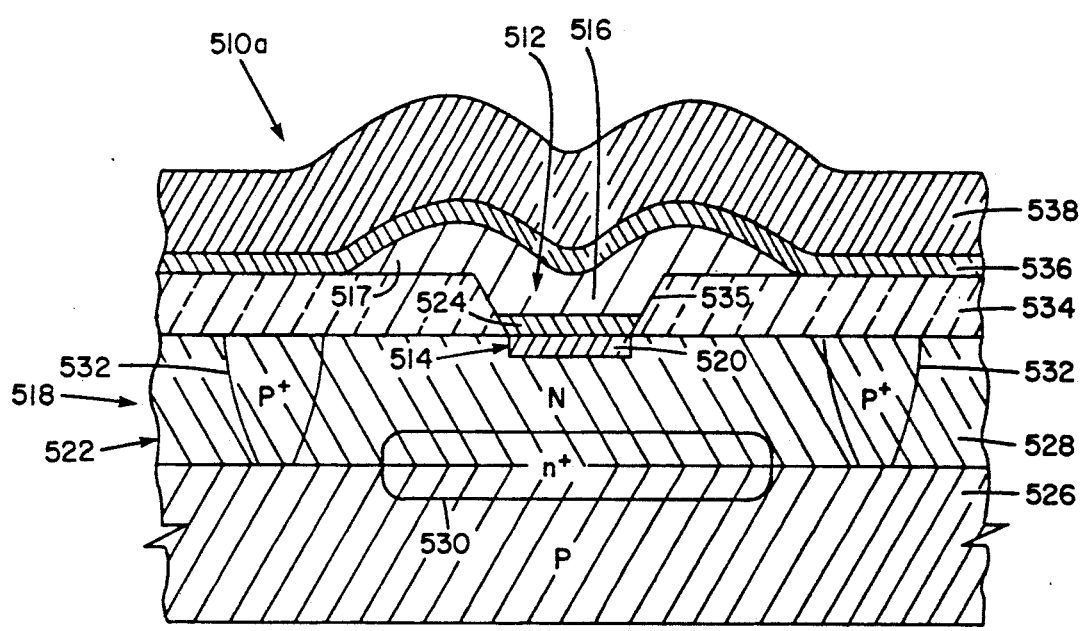
FIG. 5 is a cross-sectional view of a third embodiment of the memory cell of the present invention.

Referring now to FIG. 5, shown is memory cell 510a of a third embodiment of the present invention, which may be substituted for memory cell 10a (FIG. 1) in the array 100 of FIG. 2. Memory cell 510a is constructed similarly to memory cell 10a in all respects except for the formation of lower barrier layer 524. Such lower barrier layer 524, here comprising a refractory metal or refractory metal alloy (e.g. TiW), is deposited in a similar manner as lower barrier layer 24 of FIG. 1 to cover metal contact (e.g., PtSi) layer 520 and extend up the sloped sidewalls of opening 535 and over upper surface portions of insulating ($SiO_2$) layer 534. The portions of lower barrier which are not disposed directly over metal contact 520 are removed by conventional photolithographic techniques known as "etch-back" techinques, thereby leaving behind only that portion of lower barrier layer 524 which is disposed within opening 535 and directly over metal contact 520 as shown in FIG. 5, such lower barrier layer portion 524 here having a thickness of approximately 500 angstroms. Amorphous silicon layer 517 is then disposed over lower barrier layer 524 and $SiO_2$ layer 534, as shown, with the memory region 516 of such layer 517 being disposed above lower barrier layer 524. Metal strip 538, here comprising aluminium, is disposed above amorphous silicon layer 517 and is separated therefrom, and from regions of insulating layer 534 not covered by amorphous silicon layer 517, by upper barrier layer 536. Here, upper barrier layer 536 comprises a refractory metal such as Ti, or an alloy thereof, such as TiW. With such arrangement, lower barrier layer 524 remains only in the regions of memory cell 510a where such lower barrier layer 524 provides separation between amorphous silicon memory region 516 and metal contact 520.

Having described preferred embodiments of the present invention, modifications and alterations thereof may become apparent to those having ordinary skill in the art. For example, the thicknesses recited for the various regions or layers of the embodiments of the memory cell of the present invention are illustrative only, and other material thicknesses may be substituted therefor. Also, other suitable techniques besides sputtering and chemical vapor deposition may be used to form the barrier layers. Accordingly, it is understood that the present invention is limited only by the scope of the appended claims.

What is claimed is:

1. A memory cell comprising:
   (a) a body comprising semiconductor material;
   (b) a diode contact region in the body comprising a combination of conducting material with the semiconductor material of the body;
   (c) a memory region having a first state of substantial electrical nonconductivity, said memory region being programmable to a second state of substantial electrical conductivity in response to an electrical signal applied thereto, said memory region being disposed over the body and vertically above the contact region; and
   (d) a barrier layer comprising a refractory metal disposed in contact with the memory region and disposed between the memory region and the contact region to inhibit material of said memory region from combining with material of said contact region.

2. The memory cell of claim 1 wherein said refractory metal comprises titanium (Ti).

3. The memory cell of claim 1 wherein said refractory metal comprises an alloy of titanium (Ti) and tungsten (W).

4. The memory cell of claim 1 wherein said contact region and said semiconductor material of said body form a Schottky diode.

5. The memory cell of claim 1 wherein said memory region comprises amorphous silicon.

6. A memory cell comprising:
   (a) a material layer having a relatively high nominal resistance, said material layer being programmable to a relatively low resistance in response to an electrical signal applied thereto;
   (b) a Schottky diode contact comprising a silicide disposed below said material layer; and
   (c) a barrier layer comprising a refractory metal disposed between and in contact with both the material layer and the Schottky diode contact to inhibit material of said memory region from combining with material of said contact region, said barrier layer having a higher eutectic temperature than a eutectic temperature of the Schottky diode contact wherein the material layer, the Schottky diode contact, and the barrier layer are arranged vertically.

7. The memory cell of claim 6 wherein said material layer comprises amorphous silicon.

8. A memory cell comprising:
   (a) a semiconductor layer comprising amorphous silicon, said amorphous silicon being substantially electrically nonconductive;
   (b) body means for supporting the semiconductor layer;
   (c) a contact comprising a silicide disposed on the body means;
   (d) means for applying an electrical signal to the semiconductor layer to set the semiconductor layer to an electrically conductive state, said electrical signal generating heat in the semiconductor layer; and
   (e) a barrier layer comprising a refractory metal disposed between the semiconductor layer and the contact and in contact with both the semiconductor layer and the contact, to inhibit combining of material of said contact with silicon material of said semiconductor layer in response to the generated heat.

9. The memory cell of claim 8 wherein the contact and semiconductor layer of the body means form a Schottky diode.

10. The memory cell of claim 9 wherein the contact comprises platinum (Pt).

11. The memory cell of claim 8 wherein the electrical signal applying means comprises an input terminal electrically coupled to the semiconductor layer, and further comprising means, disposed between the input terminal and the semiconductor layer, for inhibiting combination of material of the input terminal with silicon material of the semiconductor layer.

12. The cell of claim 11 wherein said means for inhibiting comprises a refractory metal.

13. A memory cell having vertically disposed elements comprising:
   (a) a material layer having a substantially electrically nonconductive state settable to a substantially electrically conductive state and subsequently nonresettable to the substantially electrically nonconductive state;
   (b) an input terminal electrically coupled to the material layer;
   (c) a first barrier layer disposed between the input terminal and the material layer, the first barrier layer comprising a refractory metal;
   (d) body means for supporting the material layer, said body means including:
       (i) a semiconductor substrate;
       (ii) a semiconductor layer disposed above the substrate;
       (iii) an output terminal disposed between the semiconductor substrate and the semiconductor layer; and
       (iv) a contact comprising a silicide; and
   (e) a second barrier layer disposed between and in contact with both the material layer and the contact of the body means to inhibit material of said material layer from combining with material of said contact, said second barrier layer comprising a refractory metal.

14. The memory cell of claim 13 wherein said material layer comprises amorphous silicon and said refractory metal comprises a titanium-tungsten (TiW) alloy.

15. A programmable memory array comprising a plurality of memory cells, each one of the plurality of memory cells comprising:

a memory region having an electrically nonconductive state settable to an electrically conductive state;

a body means for supporting the memory region, said body means comprising a silicide contact electrically coupled to the memory region; and a barrier layer comprising a refractory metal, said barrier layer being disposed between and in contact with both the silicide contact and the memory region to inhibit material of said memory region from combining with material of said contact.

* * * * *